(12) United States Patent
Lai et al.

(10) Patent No.: US 8,518,487 B2
(45) Date of Patent: Aug. 27, 2013

(54) METHOD OF FORMING ORGANIC FILM

(75) Inventors: Li-Wen Lai, Taichung (TW); Yi-Long Wang, Taichung (TW); Chun-Hao Chang, Kaohsiung (TW); Tai-Hung Chen, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/337,317

(22) Filed: Dec. 27, 2011

(65) Prior Publication Data

US 2013/0089667 A1    Apr. 11, 2013

(30) Foreign Application Priority Data

Oct. 6, 2011    (TW) .............................. 100136277 A

(51) Int. Cl.
*C23C 16/448*    (2006.01)

(52) U.S. Cl.
USPC ........................................ 427/255.6; 427/294

(58) Field of Classification Search
USPC .............................................. 427/255.6, 294
See application file for complete search history.

(56) References Cited

U.S. PATENT DOCUMENTS

| | | | | |
|---|---|---|---|---|
| 5,534,068 A * | 7/1996 | Beach et al. | ................... | 118/719 |
| 5,536,319 A * | 7/1996 | Wary et al. | ................... | 118/719 |
| 5,709,753 A * | 1/1998 | Olson et al. | ................... | 118/719 |
| 5,908,506 A * | 6/1999 | Olson et al. | ................... | 118/708 |
| 6,060,109 A | 5/2000 | Tanaka et al. | | |
| 2009/0041929 A1 * | 2/2009 | Ohmi et al. | ...................... | 427/66 |
| 2011/0056729 A1 | 3/2011 | Dadd et al. | | |
| 2011/0151121 A1 * | 6/2011 | Chang et al. | ............... | 427/255.6 |

FOREIGN PATENT DOCUMENTS

| | | |
|---|---|---|
| CN | 101956176 | 1/2011 |
| TW | I229702 | 3/2005 |
| TW | 200541387 | 12/2005 |
| TW | I261627 | 9/2006 |
| TW | 200811302 | 3/2008 |
| TW | 201005119 | 2/2010 |
| TW | 201009109 | 3/2010 |
| TW | 201102448 | 1/2011 |

OTHER PUBLICATIONS

Jia, Zhang, et al., "Laboratory pentacene and parylene evaporation systems for fabricating organic thin film devices". J. Vac. Sci. Technol. B 29(2), Mar./Apr. 2011, 022401-1 to 022401-5.*

(Continued)

*Primary Examiner* — Bret Chen
(74) *Attorney, Agent, or Firm* — Jianq Chyun IP Office

(57) ABSTRACT

A method of forming an organic film is provided and includes followings. An apparatus is provided and includes a gas storage chamber, an evaporator, a pressure gauge, a pyrolysis chamber connected with the gas storage chamber, and a deposition chamber. The evaporator connects with the pyrolysis chamber through the gas storage. An organic material in the evaporator is evaporated to form organic gas, wherein the organic gas is passed into the gas storage chamber. When pressure of the organic gas in the gas storage chamber, measured by the pressure gauge, reaches a predetermined value, a valve between the evaporator and the gas storage chamber is turned off and another valve is turned on for passing the organic gas into the pyrolysis chamber. The organic gas is pyrolyzed in the pyrolysis chamber to form a monomer. The monomer is delivered to the deposition chamber for deposition to form an organic film.

15 Claims, 3 Drawing Sheets

(56) References Cited

OTHER PUBLICATIONS

Advanced Coating: Parylene Conformal Coating Specialists, http://www.conformal-coating.com/parylene_coating.htm. 2000, pp. 1-2.*

Dolbier et al., "Parylene-AF4: a polymer with exceptional dielectric and thermal properties", Journal of Fluorine Chemistry 122, 2003, p. 97-104.

Chou et al., "Preparation of plasma-polymerized para-xylene as an alternative to parylene coating for biomedical surface modification", Surface & Coatings Technology 204, 2010, p. 1631-1636.

Wei et al., "Thickness-controlled hydrophobicity of fibrous Parylene-C films", Materials Letters 64, 2010, p. 1063-1065.

Mathur et al., "Vapor deposition of parylene-F using hydrogen as carrier gas", Journal of Materials Research, J. Mater. Res., vol. 14, No. 1, Jan. 1999, p. 246-250.

Yu et al., "Introduction and Development of the Flexible Water Vapor/Oxygen Barrier Films Technology", Journal of Industrial Materials vol. 275, Nov. 2009, p. 112-120.

Hong et al., "Encapsulated Material Technology of Flexible Electronics"; Journal of Industrial Materials vol. 272, Aug. 2009, p. 50-61.

* cited by examiner

METHOD OF FORMING ORGANIC FILM

CROSS-REFERENCE TO RELATED APPLICATION

This application claims the priority benefit of Taiwan application serial no. 100136277, filed on Oct. 6, 2011. The entirety of the above-mentioned patent application is hereby incorporated by reference herein and made a part of this specification.

TECHNICAL FIELD

The disclosure relates to an evaporation apparatus and a method of forming an organic film.

BACKGROUND

Organic film has superior capability in water resistance and gas resistance, high transparency, better in electrical insulation, in preventing rust, corrosion, and efflorescence. Thus, the organic film is usually adopted as the gas barrier layer which is formed on the surface of the flexible substrate in current flexible displays. Moreover, the organic film is also adopted as the release layer for the flexible display.

In conventional fabrication, an organic film is generally formed by a chemical vapor deposition (CVD) method. Taking a parylene film as an example, powdered parylene is placed in an evaporator and heated to about 150° C. for evaporating powdered parylene. Parylene gas is then passed to a pyrolysis chamber and heated to about 650° C. for pyrolysis. Next, parylene monomer is delivered to a deposition chamber and deposited on a substrate.

However, since organic material is likely to heat unevenly in the evaporator, the evaporated organic material is not able to pass to the pyrolysis chamber stably and continuously. Accordingly, the organic film formed by deposition may have a non-uniform thickness, and reproducibility of the organic films is not manufacturale.

SUMMARY

The disclosure demonstrates an evaporation apparatus design which is capable of depositing material stably.

The disclosure further teaches a method of forming an organic film, which is capable of continuously fabricating the organic film and has good reproducibility.

In the disclosure, an evaporation apparatus is designed. The evaporation apparatus includes a gas storage chamber, a first evaporator, a pressure gauge, a pyrolysis chamber, and a deposition chamber. The first evaporator is connected with the gas storage chamber through a first pipe, where the first pipe has a first valve. The pressure gauge is connected with the gas storage chamber through a second pipe. The pyrolysis chamber is connected with the gas storage chamber through a third pipe, where the third pipe has a second valve. The deposition chamber is connected with the pyrolysis chamber through a fourth pipe.

The disclosure also provides a method of forming an organic film and the method involves providing an evaporation apparatus. The evaporation apparatus includes a gas storage chamber, a first evaporator, a pressure gauge, a pyrolysis chamber, and a deposition chamber. The first evaporator is connected with the gas storage chamber through a first pipe, where the first pipe has a first valve. The pressure gauge is connected with the gas storage chamber through a second pipe. The pyrolysis chamber is connected with the gas storage chamber through a third pipe, where the third pipe has a second valve. The deposition chamber is connected with the pyrolysis chamber through a fourth pipe. A first organic material is placed in the first evaporator. The second valve is turned off and the first valve is turned on. A first evaporation process is performed to the first organic material in the first evaporator to form a first organic gas, wherein the first organic gas is passed into the gas storage chamber through the first pipe. When a pressure of the first organic gas in the gas storage chamber, measured by the pressure gauge, reaches a predetermined value, the first valve is turned off and the second valve is turned on for passing the first organic gas into the pyrolysis chamber through the third pipe. The first organic gas is pyrolyzed in the pyrolysis chamber to form a first organic monomer. The first organic monomer is delivered to the deposition chamber through the fourth pipe for deposition, so as to form a first organic film.

Accordingly, in the disclosure, when the pressure of the gas in the gas storage chamber reaches the predetermined value, that is, a specific amount of the gas is stored in the gas storage chamber, the gas is then passed to the subsequent chamber for deposition. Therefore, the gas storage chamber is able to supply the gas stably for continuous deposition process, and the thickness uniformity of the film and reproducibility of the films are good.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF EMBODIMENTS

Figure 1:
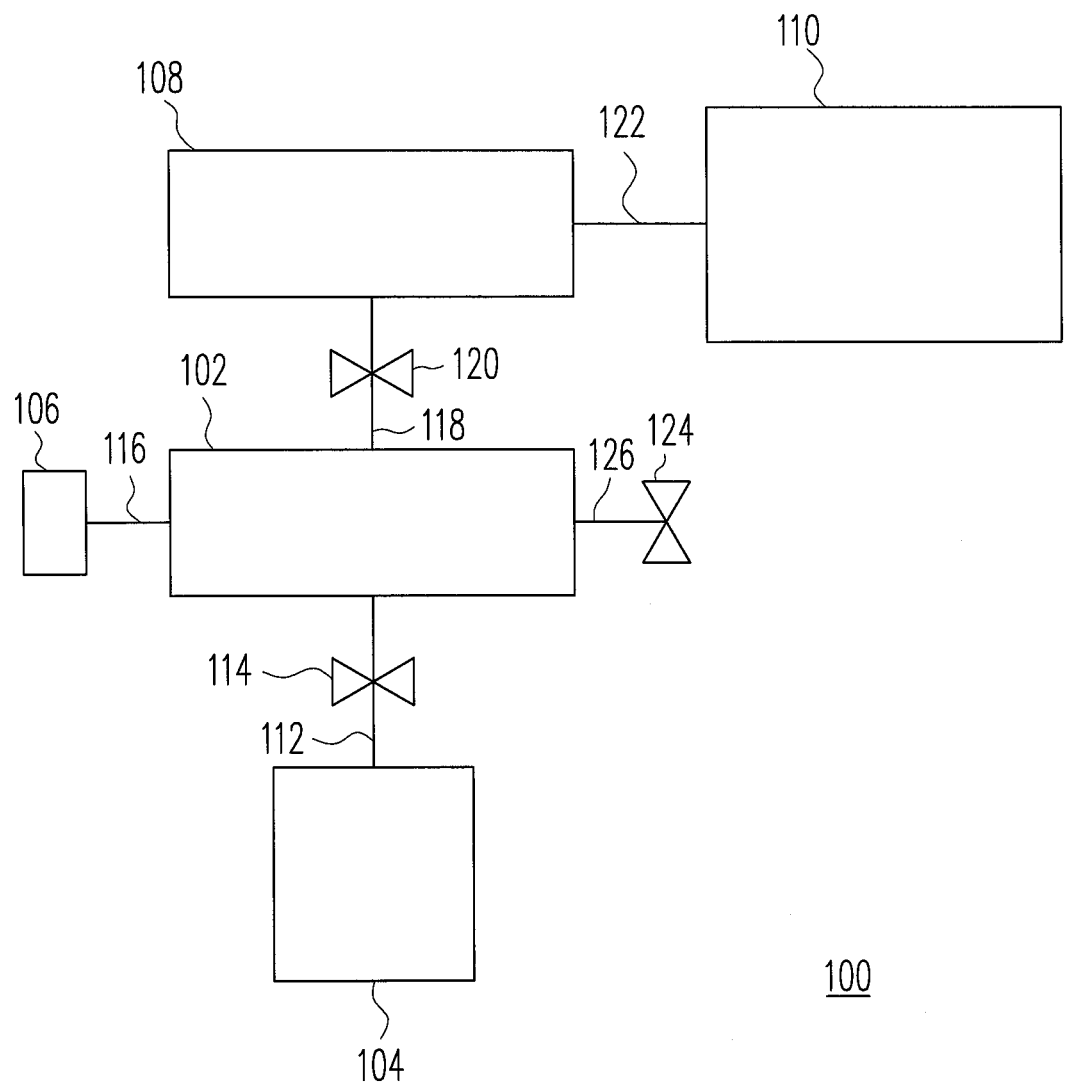
FIG. 1 is a schematic view of an evaporation apparatus according to one embodiment of the disclosure.

FIG. 1 is a schematic view of an evaporation apparatus according to one embodiment of the disclosure. Referring to FIG. 1, an evaporation apparatus 100 includes a gas storage chamber 102, a first evaporator 104, a pressure gauge 106, a pyrolysis chamber 108, and a deposition chamber 110. The gas storage chamber 102 is configured to store a reactive gas which is delivered from the first evaporator 104. The first evaporator 104 is connected with the gas storage chamber 102 through a first pipe 112, where the first pipe 112 has a first valve 114. The first evaporator 104 is configured to evaporate a material to form the reactive gas, which is then passed into the gas storage chamber 102. The first valve 114 is configured to control whether or not to pass the reactive gas generated in the first evaporator 104 into the gas storage chamber 102. In an embodiment, the first evaporator 104 is disposed with a material container therein to contain the material to be evaporated.

The pressure gauge 106 is connected with the gas storage chamber 102 through a second pipe 116. The pressure gauge 106 is configured to measure the pressure of the gas in the gas storage chamber 102. The pyrolysis chamber 108 is connected with the gas storage chamber 102 through a third pipe 118, where the third pipe 118 has a second valve 120. The pyrolysis chamber 108 is configured to perform a pyrolysis to the reactive gas which is delivered from the gas storage chamber 102. The second valve 120 is configured to control whether or not to pass the reactive gas stored in the gas storage chamber 102 into the pyrolysis chamber 108. The deposition chamber 110 is connected with the pyrolysis chamber 108 through a fourth pipe 122. The deposition chamber 110 is configured to deposit the reactive gas delivered from the pyrolysis chamber 108 by a chemical deposition process, for example, so as to form a film on a substrate to be deposited in the deposition chamber 110. The first and second valve 114, 120 are, for example, an air actuated valve, respectively.

Furthermore, the evaporation apparatus 100 includes a pressure adjusting valve 124 connected with the gas storage chamber 102 through a fifth pipe 126. The pressure adjusting valve 124 is configured to pass a pressure adjusting gas into the gas storage chamber 102, so as to adjust the pressure of the gas in the gas storage chamber 102. In particular, since the evaporated reactive gas is likely to deposit when the temperature of the environment is lower than its evaporation temperature, the evaporation apparatus 100 usually includes a constant temperature maintaining device (not shown), so that the evaporated reactive gas may be maintained in an evaporation state. In an embodiment, the evaporation apparatus 100 further includes a supply line of carrier gas connected with the gas storage chamber 102 through a pipe (not shown). The supply line of carrier gas is configured to supply the carrier gas for carrying the reactive gas in the gas storage chamber 102 to the pyrolysis chamber 108 through the third pipe 118. In an embodiment, the evaporation apparatus 100 further includes a supporting device (not shown), which is configured to dispose a substrate in the deposition chamber 110.

In the evaporation apparatus 100, the gas storage chamber 102 is connected with the first evaporator 104 and the pyrolysis chamber 108 through the first pipes 112 and the third pipe 118, respectively. The first pipes 112 and the third pipe 118 are controlled by the first and second valve 114, 120, respectively, for passing the reactive gas. Particularly, the first and second valve 114, 120 are electrically connected to the pressure gauge 106, and the turning on and off the first and second valve 114, 120 may be controlled according to the pressure of the gas in the gas storage chamber 102, respectively. In detail, when the pressure of the gas in the gas storage chamber 102, measured by the pressure gauge 106, does not reach a predetermined value, the second valve 120 may be turned off for preventing the reactive gas from passing into the pyrolysis chamber 108, and the first valve 114 may be turned on for passing the reactive gas into the gas storage chamber 102. According to the ideal gas equation PV=nRT, as the pressure P (which is the predetermined value herein), the volume V, the temperature T are constant, the pressure of the gas in the gas storage chamber 102 does not reach the predetermined value described above means the amount of the gas is not equal to a specific value. Therefore, the first valve 114 is turned on for passing the reactive gas into the gas storage chamber 102.

Moreover, when the pressure of the gas in the gas storage chamber 102, measured by the pressure gauge 106, reaches the predetermined value, that is, the amount of the gas is equal to a specific value, the first valve 114 may be turned off, and the second valve 120 may be turning on for passing the reactive gas into the pyrolysis chamber 108 for pyrolysis. Since the reactive gas is passed into the pyrolysis chamber 108 with the specific amount, continuous deposition process may be performed. Therefore, the film is formed with nice thickness uniformity and reproducibility of the multiple films is good. Particularly, the thickness of the film deposited on the substrate can be adjusted through simply setting the predetermined pressure of the reactive gas by the operator, and the film has nice thickness uniformity.

In the following, the embodiment, in which an organic film is deposited by using the evaporation apparatus 100, is provided for illustration purpose and is not construed to limiting the present disclosure.

Figure 2:
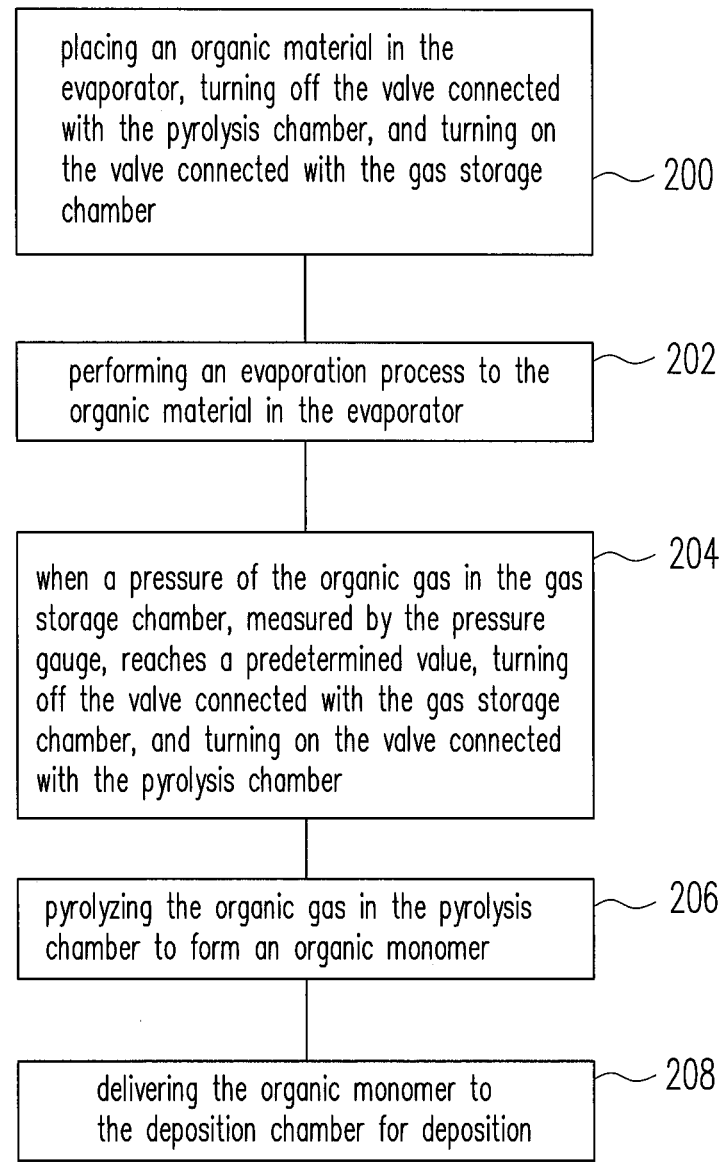
FIG. 2 is a flowchart illustrating a method of forming an organic film by using an evaporation apparatus of the disclosure.

FIG. 2 is a flowchart illustrating a method of forming an organic film by using an evaporation apparatus of the disclosure. Referring to FIGS. 1 and 2, in step 200, an organic material is placed in the first evaporator 104, the second valve 120 which is connected with the pyrolysis chamber 108 is turned off, and the first valve 114 which is connected with the gas storage chamber 102 is turned on. The organic material is, for example, in powder form. In the present embodiment, the organic material is parylene powder, for instance. Alternatively, the organic material is, for example, in liquid form, such as parylene, hexamethyldisilane (HMDS), hexamethyldisiloxane (HMDSO), hexamethyldisilazane (HMDSN), tetramethylsilane (TMS), tetraethyl orthosilicate (TEOS).

In step 202, an evaporation process is performed to the organic material in the first evaporator 104, so as to form an organic gas. In the beginning of the evaporation process, the evaporation rate of the organic material is not steady because the temperature of the first evaporator 104 is increased to the evaporation temperature of the organic material (i.e. about 150° C. when the organic material is parylene) from the room temperature. However, in the present embodiment, before the amount of the gas formed in the evaporation process is equal to a specific value, the gas is stored in the gas storage chamber 102, rather than immediately delivered to the pyrolysis chamber 108. Therefore, the subsequent deposition process is not affected by unsteady evaporation rate of the organic material.

In step 204, when the pressure of the organic gas in the gas storage chamber 102, measured by the pressure gauge 106, reaches the predetermined value, the first valve 114 is turned off and the second valve 120 is turned on for passing the organic gas into the pyrolysis chamber 108 through the third pipe 118. In other words, the predetermined value is set by the operator, and according to the ideal gas equation PV=nRT, the amount of the gas in the gas storage chamber 102 is equal to a specific value when the pressure of the organic gas in the gas storage chamber 102 reaches the predetermined value. At this moment, the organic gas is delivered to the pyrolysis chamber 108. In an embodiment, the temperature of the gas storage chamber 102 can be between 50° C. and 300° C., and the predetermined pressure can be between 50 mtorr and 1000 mtorr. Particularly, in an embodiment, when the pressure of the organic gas in the gas storage chamber 102, measured by the pressure gauge 106, does not reach the predetermined value, the pressure adjusting valve 124 is turned on for passing a pressure adjusting gas into the gas storage chamber 102 through the fifth pipe 126. The pressure adjusting gas is, for example, an inert gas, such as argon, helium, or nitrogen.

In step 206, the organic gas is pyrolyzed in the pyrolysis chamber 108 to form an organic monomer.

In step 208, the organic monomer is delivered to the deposition chamber 110 through the fourth pipe 122 for deposition, so as to form an organic film in the deposition chamber 110. In an embodiment, the organic film is formed, for example, on a substrate in the deposition chamber 110, and the substrate may be disposed on the supporting device (not shown) in the deposition chamber 110.

Figure 3:
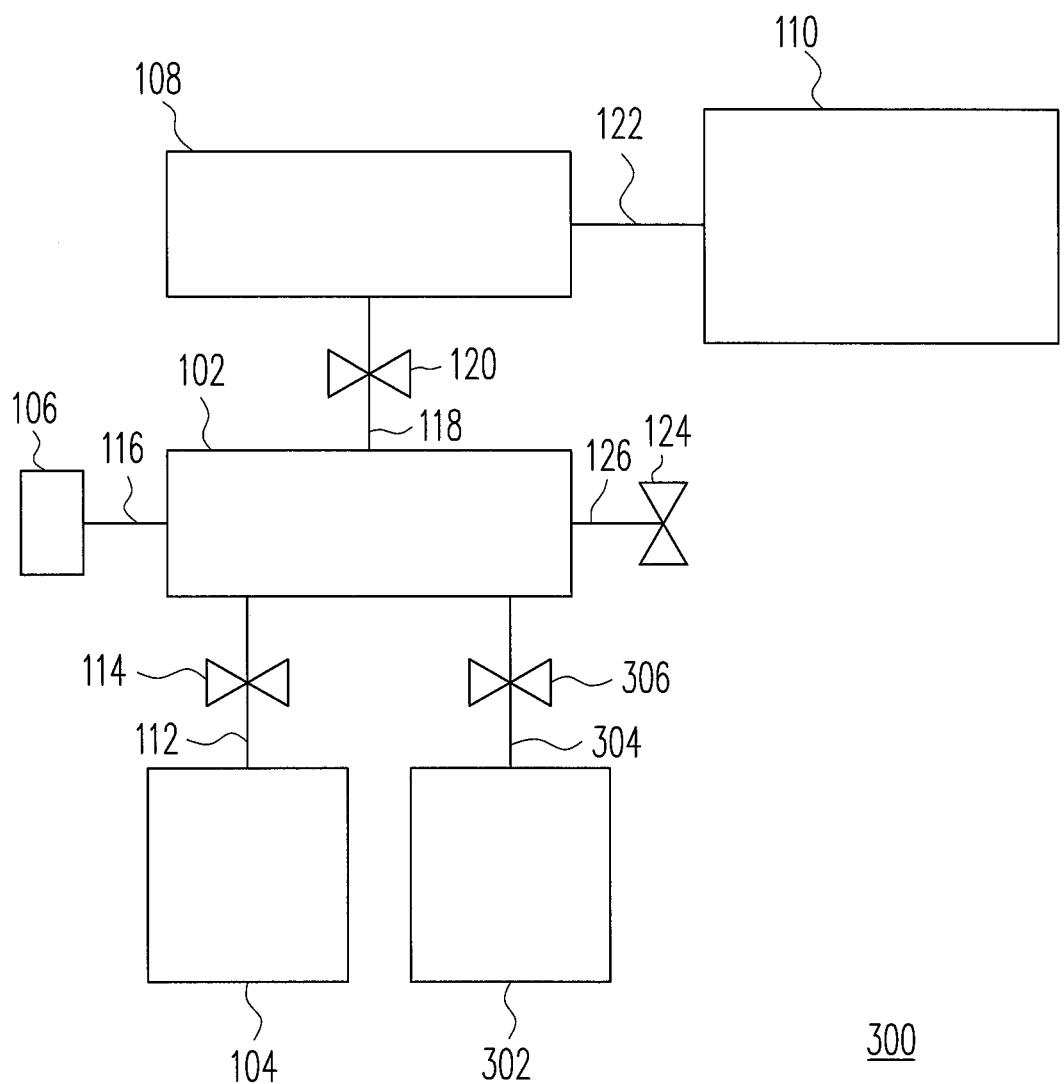
FIG. 3 is a schematic view of an evaporation apparatus according to another embodiment of the disclosure.

FIG. 3 is a schematic view of an evaporation apparatus according to another embodiment of the disclosure. In FIG. 3, the same reference numbers are used to refer to the same parts in FIG. 1, and the description for these parts is omitted. Referring to FIG. 3, the difference between the evaporation apparatus 100 and the evaporation apparatus 300 lies in the evaporation apparatus 300 further includes a second evaporator 302. The second evaporator 302 is connected with the gas storage chamber 102 through a sixth pipe 304, where the sixth pipe 304 has a third valve 306. The third valve 306 is configured to control whether or not to pass the gas generated in the second evaporator 302 to the gas storage chamber 102. The third valve 306 is, for example, an air actuated valve.

During the deposition process performed by the evaporation apparatus 300, when the material in the first evaporator 104 has been consumed, the first valve 114 can be turned off and the material in the second evaporator 302 is immediately used to generate the organic gas for replacing the material in the first evaporator 104. Therefore, the deposition process can be performed continuously.

In an embodiment, during the deposition process performed by the evaporation apparatus 300, before evaporating the first organic material in the first evaporator 104, the third valve 306 is turned off for preventing the gas passing into the second evaporator 302. That is, when an evaporation process is performed in the first evaporator 104, the second valve 120 is turned off and the first valve 114 is turned on while the third valve 306 is turned off. A first evaporation process is performed to the first organic material in the first evaporator 104 and the formed first organic gas is then passed into the gas storage chamber 102 through the first pipe 112. When the pressure of the first organic gas in the gas storage chamber 102, measured by the pressure gauge 106, reaches the predetermined value, the first valve 114 is turned off and the second valve 120 is turned on for passing the first organic gas into the pyrolysis chamber 108 through the third pipe 118. The first organic gas is pyrolyzed in the pyrolysis chamber 108 to form a first organic monomer, and the first organic monomer is then delivered to the deposition chamber 110 through the fourth pipe 122 for deposition, so as to form a first organic film in the deposition chamber 110. After the first organic material in the first evaporator 104 has been consumed, the first valve 114 is turned off, and a second organic material is placed in the second evaporator 302 while the third valve 306 is turned on. A second evaporation process is performed to the second organic material in the second evaporator 302, so as to form a second organic gas. Similarly, the third valve 306 is turned on for passing the second organic gas into the gas storage chamber 102 through the sixth pipe 304 before the pressure of the second organic gas in the gas storage chamber 102 reaches the predetermined value. When the pressure of the second organic gas in the gas storage chamber 102 reaches the predetermined value, the third valve 306 is turned off, and the second valve 120 is turned on for passing the second organic gas into the pyrolysis chamber 108 through the third pipe 118. After that, the second organic gas is pyrolyzed in the pyrolysis chamber 108 to form a second organic monomer, and the second organic monomer is delivered to the deposition chamber 110 through the fourth pipe 122 for deposition, so as to form a second organic film on the substrate disposed in the deposition chamber 110. In general, the second organic material is the same as the first organic material and can be the organic materials illustrated in the aforementioned embodiment.

In the present embodiment, the evaporation apparatus 300 includes two evaporators, and therefore the second evaporator 302 can be used to perform the chemical deposition process when the material in the first evaporator 104 has been consumed. Meanwhile, the material can be refilled in the first evaporator 104. Similarly, when the material in the second evaporator 302 has been consumed, the first evaporator 104 with refilled material is used. As a consequence, the continuous fabrication can be achieved by alternately using the evaporators without stopping the apparatus to supplement the materials. It is noted that in other embodiment, the evaporation apparatus can optionally include more than two evaporators disposed therein. Furthermore, the evaporation apparatus described in aforementioned embodiments is suitable for fabricating a release layer, a gas barrier layer or other devices in a manufacturing process of a flexible display, a flexible solar cell and a film package.

In the conventional forming method of the organic film, the organic material is heated and evaporated in the evaporator, and the evaporation rate of the organic material is not steady because the material is heated unevenly and the volume change of the material is not linear. Therefore, the evaporation rate of the organic material is decreased as the amount of the organic material is decreased, which results in significant difference (such as 15% to 20%) in thickness between the films. In other words, reproducibility of the films fabricated in the deposition process is poor. However, in the aforementioned embodiment, the gas is passed from the gas storage chamber into the subsequent chamber for deposition after a specific amount of the gas is stored in the gas storage chamber. Therefore, the gas storage chamber is able to supply the gas stably for continuous deposition process, and the formed film has nice thickness uniformity. Moreover, reproducibility of the films in thickness is good, such as the difference in thickness between the films is lower than 5%.

In summary, the evaporation apparatus of the disclosure includes the gas storage chamber, the pressure gauge, the first valve, and the second valve. The gas storage chamber is configured to store the reactive gas delivered from the evaporator, and the pressure gauge is configured to measure the pressure of the gas in the gas storage chamber. The first valve is configured to control whether or not to pass the gas generated in the evaporator to the gas storage chamber, and the second valve is configured to control whether or not to pass the gas stored in the gas storage chamber to the pyrolysis chamber. When the pressure of the gas in the gas storage chamber reaches the predetermined value, the gas is passed into the subsequent chamber for deposition by turning off the first valve and turning on the second valve. Therefore, the gas storage chamber is able to supply the gas stably for continuous deposition process, the formed film has nice thickness uniformity, and reproducibility of the films in thickness is good. Moreover, by disposing a plurality of the evaporators in the evaporation apparatus and using the evaporators alternately, the continuous fabrication can be achieved without stopping the apparatus to supplement the materials.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:
1. A method of forming an organic film, comprising:
providing an evaporation apparatus, the evaporation apparatus comprising:
a gas storage chamber;
a first evaporator, connected with the gas storage chamber through a first pipe, wherein the first pipe has a first valve;

a pressure gauge, connected with the gas storage chamber through a second pipe;

a pyrolysis chamber, connected with the gas storage chamber through a third pipe, wherein the third pipe has a second valve, wherein the first evaporator is connected with the pyrolysis chamber through the gas storage chamber, and the gas storage chamber is disposed between the first evaporator and the pyrolysis chamber; and a deposition chamber, connected with the pyrolysis chamber through a fourth pipe;

placing a first organic material in the first evaporator, and turning off the second valve and turning on the first valve;

performing a first evaporation process to the first organic material in the first evaporator, so as to form a first organic gas, wherein the first organic gas is passed into the gas storage chamber through the first pipe and stored in the gas storage chamber;

when a pressure of the first organic gas stored in the gas storage chamber reaches a predetermined value, that is, the amount of the first organic gas is equal to a specific value, turning off the first valve and turning on the second valve for passing the first organic gas into the pyrolysis chamber through the third pipe;

pyrolyzing the first organic gas in the pyrolysis chamber to form a first organic monomer; and delivering the first organic monomer to the deposition chamber through the fourth pipe for deposition, so as to form a first organic film.

2. The method of forming the organic film as claimed in claim 1, wherein the first organic material is parylene.

3. The method of forming the organic film as claimed in claim 1, wherein the first organic material is in powder or liquid form.

4. The method of forming the organic film as claimed in claim 1, wherein the predetermined value is between 50 mtorr and 1000 mtorr.

5. The method of forming the organic film as claimed in claim 1, wherein the evaporation apparatus further comprises a pressure adjusting valve connected with the gas storage chamber through a fifth pipe.

6. The method of forming the organic film as claimed in claim 5, when the pressure of the first organic gas in the gas storage chamber, measured by the pressure gauge, does not reach the predetermined value, turning on the pressure adjusting valve for passing a pressure adjusting gas into the gas storage chamber through the fifth pipe.

7. The method of forming the organic film as claimed in claim 6, wherein the pressure adjusting gas comprises an inert gas.

8. The method of forming the organic film as claimed in claim 1, wherein the evaporation apparatus further comprises a second evaporator connected with the gas storage chamber through a sixth pipe, wherein the sixth pipe has a third valve.

9. The method of forming the organic film as claimed in claim 8, when the first organic material has been consumed, the method further comprising:

turning off the first valve, placing a second organic material in the second evaporator, and turning on the third valve;

performing a second evaporation process to the second organic material in the second evaporator, so as to form a second organic gas, wherein the second organic gas is passed into the gas storage chamber through the sixth pipe;

when a pressure of the second organic gas in the gas storage chamber, measured by the pressure gauge, reaches a predetermined value, turning off the third valve and turning on the second valve for passing the second organic gas into the pyrolysis chamber through the third pipe;

pyrolyzing the second organic gas in the pyrolysis chamber to form a second organic monomer; and delivering the second organic monomer to the deposition chamber through the fourth pipe for deposition, so as to form a second organic film.

10. The method of forming the organic film as claimed in claim 9, wherein the second organic material is in powder or liquid form.

11. The method of forming the organic film as claimed in claim 9, further comprising turning off the second valve after the second organic film is formed.

12. The method of forming the organic film as claimed in claim 9, wherein the evaporation apparatus further comprises a pressure adjusting valve connected with the gas storage chamber through a fifth pipe.

13. The method of forming the organic film as claimed in claim 12, when the pressure of the second organic gas in the gas storage chamber, measured by the pressure gauge, does not reach the predetermined value, turning on the pressure adjusting valve for passing a pressure adjusting gas into the gas storage chamber through the fifth pipe.

14. The method of framing the organic film as claimed in claim 13, wherein the pressure adjusting gas comprises at least one inert gas.

15. The method of forming the organic film as claimed in claim 1, wherein a temperature of the gas storage chamber is between 50° C. and 300° C.

* * * * *